United States Patent [19]

Seki et al.

[11] 4,017,749
[45] Apr. 12, 1977

[54] TRANSISTOR CIRCUIT INCLUDING SOURCE VOLTAGE RIPPLE REMOVAL

[75] Inventors: Kunio Seki; Yukio Suzuki, both of Tokyo; Yoshio Sakamoto, Kokubunji, all of Japan

[73] Assignee: Hitachi, Ltd., Japan

[22] Filed: Mar. 23, 1976

[21] Appl. No.: 669,699

[30] Foreign Application Priority Data

Oct. 6, 1975 Japan .............................. 50-119764

[52] U.S. Cl. .......................... 307/296 R; 307/255; 330/30 D; 330/40

[51] Int. Cl.² ....................................... H03K 17/00

[58] Field of Search .......... 307/296, 297, 255, 230; 330/22, 30 D; 357/69, 40; 357/51; 322/DIG. 6; 321/9 A

[56] References Cited

UNITED STATES PATENTS 3,843,935  10/1974  Seki ..................................... 330/69

*Primary Examiner*—Stanley D. Miller, Jr.
*Assistant Examiner*—B. P. Davis
*Attorney, Agent, or Firm*—Craig & Antonelli

[57] ABSTRACT

In a transistor circuit comprising a monolithic semiconductor integrated circuit including at least one first conductivity type transistor having a base connected to a signal input terminal, a collector connected to an output terminal and also connected to a source voltage supply terminal through a collector load resistance, and an emitter connected to a reference potential through an emitter resistance, and a voltage dividing resistance circuit connected externally to the integrated circuit to establish a base-emitter biasing voltage of the first conductivity type transistor, another resistance element is provided between the source voltage supply terminal and the load resistance and a second conductivity type transistor is provided with the emitter and the collector connected to the interconnection point of the two resistances and the reference potential, respectively, and the base connected to the emitter of the first conductivity type transistor, integrating a source voltage ripple removing circuit in the integrated circuit. This transistor circuit is adapted for a high output power integrated circuit and provides a wide range of operable source voltage as well as the removal of the ac ripple voltage component of the voltage source and the reduction in the number of external connecting pins.

16 Claims, 5 Drawing Figures

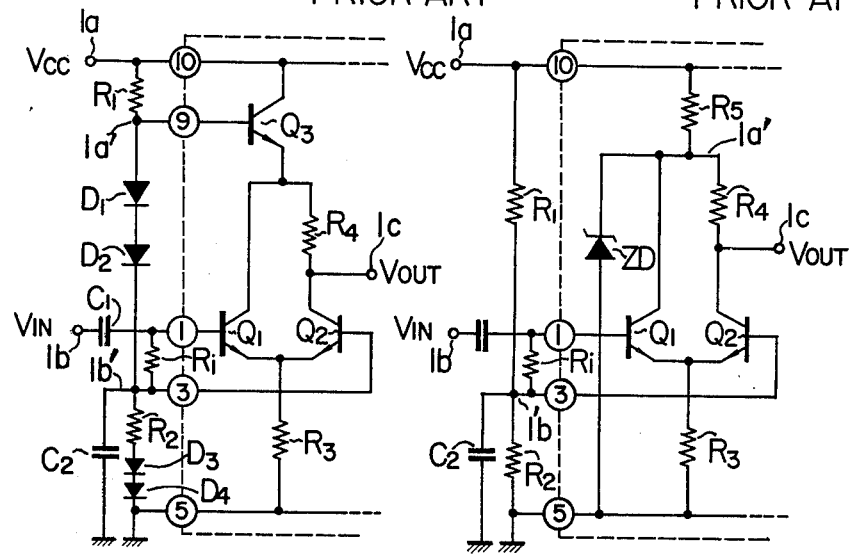
FIG.1 PRIOR ART
FIG.2 PRIOR ART
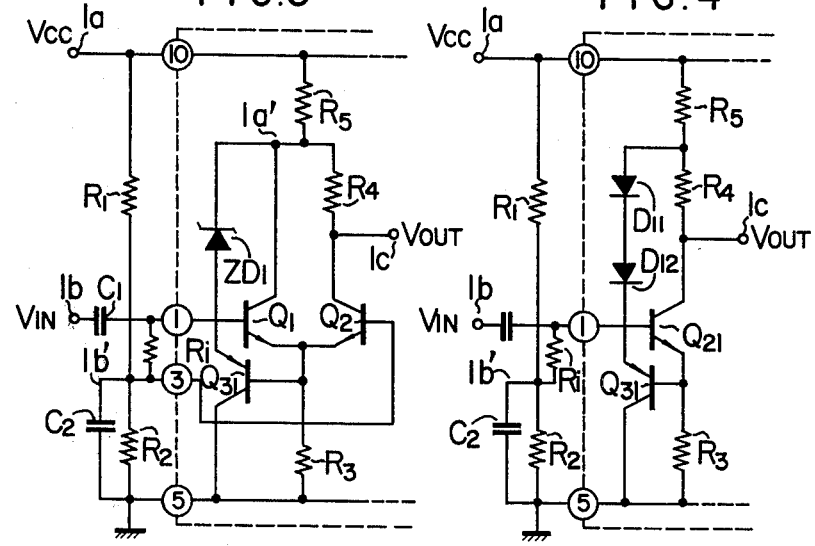
FIG.3
FIG.4

TRANSISTOR CIRCUIT INCLUDING SOURCE VOLTAGE RIPPLE REMOVAL

BACKGROUND OF THE INVENTION

1. Field of the Invention

This invention relates to a transistor circuit provided with a source voltage ripple removal circuit, and more particularly to a transistor circuit provided with source voltage ripple removal function adapted for high output monolithic power integrated circuit (IC).

2. Description of the Prior Art

For the removal of ac ripple voltage component superposed on a dc source voltage, such circuits as a CR filter circuit using a capacitor and a resistor or a constant voltage circuit using a constant voltage element, e.g. Zener diode, and a resistor have been used.

The CR filter type ripple voltage removal circuit, however, is accompanied with such problems as that in a monolithic semiconductor IC Structure an excess of external connecting pins for the voltage ripple filter are needed which make the product price of the monolithic semiconductor IC expensive.

On the other hand, the constant voltage circuit type source voltage ripple removing circuit capable of being assembled in a monolithic IC is also accompanied with such drawbacks as that since a constant voltage element such as a Zener diode is used, the ripple removal function is lost at the supply voltages below a constant voltage determined by the Zener voltage, and that the amplification function of the signal transmitting transistor circuit is lost when the signal transmitting transistor is biased in saturation region upon the rise of the source voltage and hence that the operable source voltage region is narrow.

SUMMARY OF THE INVENTION

Therefore, an object of this invention is to provide a transistor circuit provided with an improved source voltage ripple removing circuit free from the conventional problems.

Another object of this invention is to provide a transistor circuit provided with a source voltage ripple removing circuit, which reduces the number of excess external correcting pins when constituted in a monolithic semiconductor IC and hence reduces the cost of manufacture.

Further object of this invention is to provide a transistor circuit of a monolithic semiconductor IC structure provided with a source voltage ripple removing circuit having a wide range of operable source voltage.

Yet further object of this invention is to provide a transistor circuit provided with a source voltage ripple removing circuit adapted for high output power IC.

The basic structures of this invention for achieving the above objects are as disclosed in the claims.

Other objects, features and advantages of this invention will become apparent from the detailed description of the embodiments of this invention when taken in conjunction with the accompanying drawings.

BRIEF DESCRIPTION OF THE DRAWINGS

FIG. 1 is a circuit diagram showing an example of the conventional transistor circuit provided with a source voltage ripple removing circuit of the CR filter circuit type.

FIG. 2 is a circuit diagram showing an example of the conventional transistor circuit provided with a source voltage ripple removing circuit of the constant voltage circuit type.

FIG. 3 is a circuit diagram of an embodiment of the transistor circuit including a source voltage ripple removing circuit according to this invention.

FIG. 4 is a circuit diagram of another embodiment of the transistor circuit according to this invention.

DETAILED DESCRIPTION OF PREFERRED EMBODIMENTS

Figure 5:
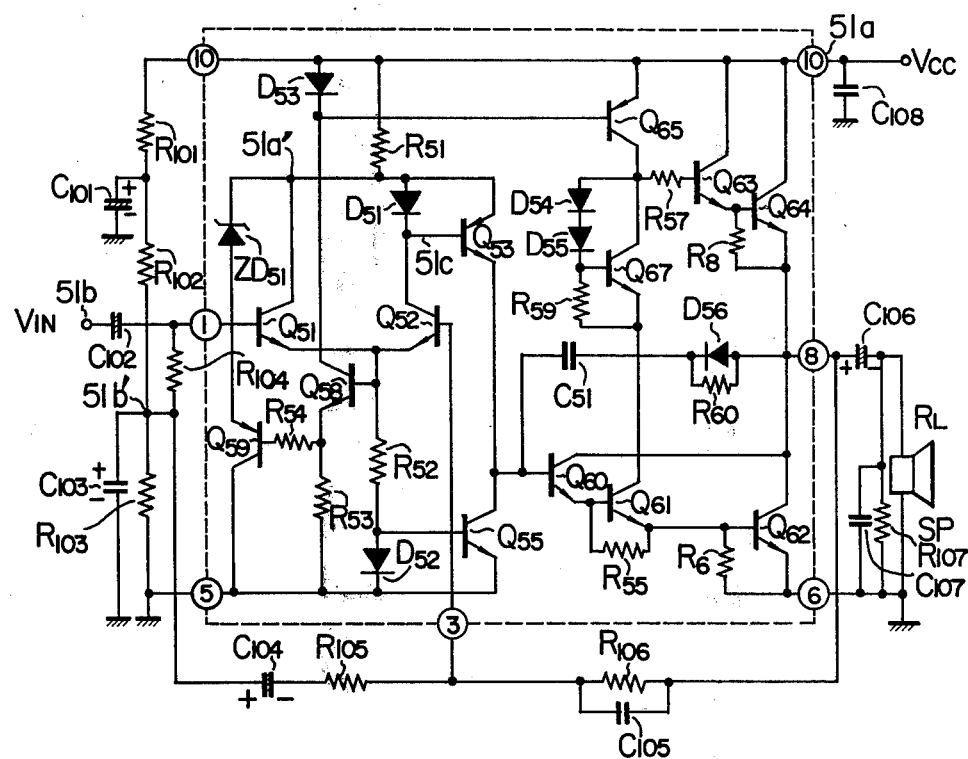
FIG. 5 is a circuit diagram of an application embodiment of the transistor circuit according to this invention.

For clarifying the background of this invention, examples of the prior art circuit will be first described with reference to the drawings preceding the description of the embodiments of this invention.

FIG. 1 shows a conventional transistor differential amplifier circuit provided with a source voltage ripple removing circuit of the CR filter type using a capacitor and a resistor. The circuit elements in the broken line such as transistors and resistors are formed in a monolithic semiconductor IC by well-known manufacturing method. Numerals enclosed in circles denote the external connecting pins of the semiconductor IC; 1 denotes an input pin, 3 a bias voltage supply pin, 5 a ground (reference potential) pin, 10 a voltage source supplying pin, and 9 a source voltage ripple filter pin. A differential amplifier is formed by transistors $Q_1$ and $Q_2$ and resistors $R_3$ and $R_4$, and a voltage dividing biasing circuit is formed by resistors $R_1$ and $R_2$ and diodes $D_1$, $D_2$, $D_3$ and $D_4$. The voltage generated at the voltage dividing point $1b'$ is applied to the bases of the differential pair transistors $Q_1$, $Q_2$. The base of the transistor $Q_1$ is connected to the input terminal $1b$ through an input coupling capacitor $C_1$ and hence is applied with the input signal $V_{in}$. An input resistor $R_i$ is connected between the bases of the two transistors. To the interconnection point $1b'$ is connected a capacitor $C_2$ for removing the source voltage ripple, which forms a CR filter circuit with the resistor $R_1$. This prevents the fluctuation of the voltages at interconnections $1a'$ and $1b'$ by the ac ripple component included in the source voltage $V_{cc}$ applied to the source voltage supply terminal $1a$. The input resistor $R_i$ connected between the input terminal $1b$ and the voltage divided point $1b'$ has a high resistance so as to increase the input impedance of the differential amplifier. For minimizing the cost of the source voltage ripple removing capacitor $C_2$, the capacitance thereof should be selected small. Hence, from the connection with the time constant $\tau(=C_2R_1)$ of the CR filter circuit, the resistance $R_1$ and $R_2$ of the voltage dividing bias circuit should be inevitably selected large. As the result, the resistors $R_1$ and $R_2$ of the voltage dividing bias circuit and the input resistor $R_i$ which are high in resistance cannot be formed with diffused resistance in the monolithic semiconductor IC and should be connected externally to the semiconductor IC through pins 10, 9, 1, 3 and 5. The voltage at the interconnection point $1a'$ which is free from the ac ripple component is supplied to the collectors of the differential transistors $Q_1$ and $Q_2$ through the base-emitter junction of the transistor $Q_3$. Similarly, the voltage at the interconnection point $1b'$ which is also free from the ac ripple is applied to the bases of the differential pair transistors $Q_1$ and $Q_2$ through the input resistor $R_i$ and directly, respectively. Thus, the ac ripple component included in the source voltage does not appear at the output terminal 1c of the differential amplifier. The diodes $D_1$ and $D_2$ are connected between the input pin 1 and the source voltage ripple filter pin 9 for supplying a sufficient collector-emitter voltage to the differential pair transistors $Q_1$ and $Q_2$.

There is another type of source voltage ripple removing circuit which utilizes a constant voltage element such as a Zener diode and a resistor. FIG. 2 shows a circuit of this type, in which a Zener diode ZD and a resistor $R_5$ are connected in series so that the voltage across the Zener diode ZD is insensitive to the source voltage ripple. In FIG. 2, the constant voltage (e.g. the Zener breakdown voltage $V_Z$) generated across the constant voltage element ZD is supplied to the source voltage supply terminal $1a'$.

Such source voltage ripple removing circuits, however, are accompanied with such drawbacks as described below.

Namely, the source voltage ripple removing circuit of the CR filter type as shown in FIG. 1 requires an extra external connecting pin (pin 9) for removing source voltage ripple and hence the manufacturing cost of the integrated circuit becomes high. On the other hand, the source voltage ripple removing circuit of the constant voltage circuit type as shown in FIG. 2 is accompanied with the problem that due to the usage of a constant voltage element such as a Zener diode ZD when the source voltage $V_{cc}$ drops below this constant voltage (e.g. the Zener voltage) of the constant voltage element, the constant voltage element such as a Zener diode ZD becomes cut off and hence the ac ripple component in the source voltage directly appears at the interconnection point $1a'$ of the transistor circuit so that the circuit function of the source voltage ripple removing circuit will be lost and next when the source voltage increases, the voltage at the interconnection point $1b'$ of the voltage dividing bias circuit also increases and if it exceeds the collector voltage of the differential pair transistors $Q_1$ and $Q_2$ which is clamped at the Zener voltage $V_Z$ of said Zener diode, so that the differential pair transistors $Q_1$ and $Q_2$ are biased in the saturation region and the differential amplification function is lost.

The present invention is to solve the above problems. Details of the embodiments of this invention will be described hereinbelow in connection with the accompanying drawings. In the figures, similar numerals denote similar parts.

FIG. 3 shows an embodiment of the transistor circuit according to the present invention. In this transistor circuit, the circuit elements enclosed in the broken line are formed in a monolithic semiconductor IC similar to the cases of FIGS. 1 and 2. The circuit comprises npn-type differential pair transistors $Q_1$ and $Q_2$, a collector load resistor $R_4$, an emitter resistor $R_3$, voltage dividing bias resistors $R_1$ and $R_2$, an input resistor $R_i$, a source voltage ripple removing resistor $R_5$, and a source voltage ripple removing transistor $Q_{31}$. The emitters of these npn-type differential pair transistors $Q_1$ and $Q_2$ are commonly connected and to the reference potential through the emitter resistor $R_3$. One end of the collector load resistor $R_4$ is connected to the collector of one transistor $Q_2$ of the npn-type differential pair transistors and the other end of the collector load resistor $R_4$ is connected to the one end of the source voltage ripple removing resistor $R_5$, and the other end of the source voltage ripple removing resistor $R_5$ is connected to the source voltage supply terminal $1a$. The voltage dividing resistors $R_1$ and $R_2$ are connected in series between the source voltage supply terminal $1a$ and the reference potential with its interconnection point $1b'$ connected to the base of the transistor $Q_2$ directly and to the base of the transistor $Q_1$ through an input resistor $R_i$ so that the bias voltage of the base-emitter junction of the npn-type differential pair transistors $Q_1$ and $Q_2$ is set by the voltage generated at the interconnection point $1b'$. The source voltage ripple removing pnp-type transistor $Q_{31}$ has the emitter connected to the interconnection point $1a'$ of the collector load resistor $R_4$ and the source voltage ripple removing resistor $R_5$ through the Zener diode $ZD_1$, the base to the emitters of the npn-type differential pair transistors $Q_1$ and $Q_2$, and the collector to the reference potential.

Further, a signal applied to the signal input terminal $1b$ is applied to the base of the transistor $Q_1$ directly.

A source voltage ripple removing capacitor $C_2$ is connected in parallel with the second voltage dividing bias resistor $R_2$ to prevent the ac ripple component at the source voltage supply terminal $1a$ from being supplied to the base of the transistors $Q_1$ and $Q_2$.

An output terminal $1c$ is connected to the collector of one transistor $Q_2$ of the npn-type differential pair transistors so as to provide an amplified output signal $V_{out}$.

Further, the Zener diode $ZD_1$ is connected between the emitter of the transistor $Q_{31}$ and the interconnection point $1a'$ so as to supply the sufficient collector-emitter voltage to the differential pair transistors $Q_1$ and $Q_2$.

According to the above structure, the objects of this invention can be achieved for the following reasons.

Namely, the ac impedance $Z_{eQ31}$, seen from the cathode side of the Zener diode, can be approximately represented as the sum of the ac dynamic resistance of the Zener diode and the ac impedance of the base-common transistor $Q_{31}$ as follows.

$$Z_{eQ31} \approx r_{ZD} + h_{ibQ31}$$

Here, $r_{ZD}$ represents the ac dynamic resistance of the Zener diode $ZD_1$ and $h_{ibQ31}$ the ac input impedance of the base-common transistor $Q_{31}$.

Thus, when an ac ripple voltage $\widetilde{V}_{cc}$ is supplied to the source voltage supply terminal $1a$, the ac ripple voltage $\widetilde{V}_p$ generated at the interconnection point $1a'$ of the source voltage ripple removing resistor $R_5$ and the collector load resistor $R_4$ becomes $$\widetilde{V}_p = \frac{Z_{eQ31}}{R_5 + Z_{eQ31}} \widetilde{V}_{cc}.$$

Namely, the ac ripple voltage $\widetilde{V}_{cc}$ supplied to the source voltage supply terminal $1a$ is attenuated by the ac impedance $Z_{eQ31}$ seen from the cathode side of the Zener diode $ZD_1$ and the source voltage ripple removing resistor $R_5$. Since the ac impedance $Z_{eQ31}$ is sufficiently small compared to the source voltage ripple removing resistance $R_5$, the ripple voltage $\widetilde{V}_p$ generated at the interconnection point $1a'$ becomes sufficiently small and hence the ac ripple voltage leaking to the output terminal $1c$ through the collector load resistance $R_4$ becomes sufficiently small.

Since the source voltage ripple removing circuit according to this invention comprises a resistor $R_5$ and a transistor $Q_{31}$, it can be easily assembled in a monolithic semiconductor IC, enabling reduction in the number of the external connecting pins of the monolithic semiconductor IC and in the cost of the product.

Further, according to the present source voltage ripple removing circuit, even when the dc voltage $V_{cc}$ supplied to the source voltage supply terminal $1a$ drops down, the ripple removing circuit does not lose its function unless the source voltage ripple removing pnp-type transistor $Q_{31}$ and the Zener diode $ZD_1$ having a Zener voltage of $V_Z$ are cut off, i.e. if $V_{cc} < V_Z + V_{BEQ31}$. Further, upon a rise of the source voltage, the voltage $Va'$ at the interconnection point $1a'$ readily follows the source voltage as represented below and hence the differential pair transistors $Q_1$ and $Q_2$ are not biased in the saturation condition and achieve a wide range of operable source voltage.

$$Va' = \frac{R_2}{R_1 + R_2} V_{cc} - V_{BEQ1} + V_{BEQ31} + V_z$$

Here, $V_{BEQ1}$ and $V_{BEQ31}$ are base-emitter voltages of the transistors $Q_1$ and $Q_{31}$.

As is apparent, this invention is not limited to the above embodiment, but can be modified in various ways.

FIG. 4 shows another embodiment of the present transistor circuit, in which an amplifier circuit using an ordinary emitter-common npn-type transistor is adapted in place of the differential amplifier circuit of FIG. 3 and the Zener diode $ZD_1$ of FIG. 3 is replaced with series connection diodes $D_{11}$ and $D_{12}$. The operational principles of the circuit of FIG. 4 are similar to those of the circuit of FIG. 3 and similar effects are provided.

FIG. 5 shows an embodiment of a power amplifier for audio use employing the present transistor circuit as the first amplifier circuit stage. In FIG. 5, circuit components of transistors, diodes, resistors, etc. enclosed in the broken line are formed in a monolithic semiconductor IC in a silicon chip by well-known manufacturing methods. Numbers enclosed in circles denote the external connecting pins of the semiconductor IC; an input pin 1, a feed-back pin 3, ground pins 5 and 6, an output pin 8, and a power source pin 10.

A pair of npn transistors $Q_{51}$ and $Q_{52}$ serve as differential pair transistors. A diode $D_{51}$ connected to the collector of the transistor $Q_{52}$ serves as a collector load. A resistor $R_{52}$ connected to the emitters of the pair transistors $Q_{51}$ and $Q_{52}$ serves as the emitter impedance. A resistor $R_{51}$ connected to the collectors of the pair transistors $Q_{51}$ and $Q_{52}$ (through the diode $D_{51}$) and to a Zener diode $ZD_{51}$ serves as a source voltage ripple removing impedance. A pnp-type transistor $Q_{59}$ is so connected in the monolithic semiconductor IC that it serves as a source voltage ripple removing transistor. Voltage dividing biasing resistors $R_{102}$ and $R_{103}$ are connected in series between the source voltage supply terminal 10 and the reference potential (pin 5) through source voltage ripple removing filter consisting of a capacitor $C_{101}$ and a resistor $R_{101}$. The interconnection point $51b'$ of the voltage dividing resistors $R_{102}$ and $R_{103}$ is connected to the pin 1 through a resistor $R_{104}$ and supplies a divided dc voltage to the base of the differential transistor $Q_{51}$. The source voltage ripple removing filter consisting of the resistor $R_{101}$ and the capacitor $C_{101}$ prevents the ac ripple component supplied from the pin 10 from directly transmitting to the base of the differential transistor $Q_{51}$. The base of this differential transistor $Q_{51}$ is also connected to an input terminal $51b$ through an input coupling capacitor $C_{102}$ to receive input signals $V_{in}$. Differential signal current based on this input signal $V_{in}$ flows through the differential pair transistors $Q_{51}$ and $Q_{52}$ to bias a diode $D_{51}$ which serves as a collector load means to generate a biasing voltage across the diode $D_{51}$. This biasing voltage biases the base-emitter junction of the transistor $Q_{53}$ to provide a signal current dependent on the differential signal current, from the collector of the transistor $Q_{53}$.

Further, since the interconnection point at which the emitters of the differential pair transistors $Q_{51}$ and $Q_{52}$ are commonly connected is held at an approximately constant voltage, a constant current is allowed to flow through the collector-emitter path of the transistor $Q_{58}$ the base of which is connected to said emitters. The constant current flowing through the transistor $Q_{58}$ biases a diode $D_{53}$ and also allows constant currents to flow through a resistor $R_{53}$ and a diode $D_{52}$. Thus, a constant current is allowed to flow also through the collector of a transistor $Q_{55}$. The differential signal component current flowing through the collectors of these transistors $Q_{53}$ and $Q_{55}$ is supplied to the base of a transistor $Q_{60}$ in the following stage. A Zener diode $ZD_{51}$ is connected between the collector of the differential transistor $Q_{51}$ and the emitter of the source voltage ripple removing transistor $Q_{59}$ and supplies a sufficient collector-emitter voltage to the differential pair transistors $Q_{51}$ and $Q_{52}$. Transistors $Q_{60}$, $Q_{61}$, $Q_{62}$, $Q_{63}$ and $Q_{64}$ form a modified push-pull power amplifier stage. When the base signal current of the transistor $Q_{60}$ increases, the transistors $Q_{60}$, $Q_{61}$ and $Q_{62}$ become conductive and the transistors $Q_{63}$ and $Q_{64}$ become non-conductive so as to decrease the output voltage at the pin 8. When the base signal current of the transistor $Q_{60}$ decreases, the transistors $Q_{60}$, $Q_{61}$ and $Q_{62}$ become non-conductive and the transistors $Q_{63}$ and $Q_{64}$ become conductive so as to increase the output voltage at the pin 8. Thus, push-pull operation is achieved. An idling circuit is formed by diodes $D_{54}$ and $D_{55}$, a resistor $R_{59}$ and a transistor $Q_{67}$ and reduces the distortion factor of such a modified push-pull power amplifier. The base-emitter junction of a transistor $Q_{65}$ is biased by the biasing voltage of the diode $D_{53}$ and a constant current is allowed to flow through the transistor $Q_{65}$, which serves as the constant current collector load of the transistor $Q_{61}$. A feed-back circuit including resistors $R_{105}$ and $R_{106}$, capacitors $C_{104}$ and $C_{105}$ is connected to the output pin 8 and the feed-back pin 3. This provides dc-ac negative feed-back for the power amplifier for audio use. To the output pin 8, a loud speaker SP is connected through an output capacitor $C_{108}$.

In this embodiment, the ac impedance at the interconnection point $51a'$ of the source voltage ripple removing resistor $R_{51}$ and the Zener diode $ZD_{51}$ is given by $$Z_e = r_{ZD51} + h_{ibQ59} + \frac{R_{54}}{h_{feQ59}},$$

where $r_{ZD51}$ is the ac dynamic resistance of the Zener diode $ZD_{51}$, $h_{ibQ59}$ the ac input impedance of the base-common transistor $Q_{59}$, and $h_{feQ59}$ the ac current amplification factor of the emitter-common transistor $Q_{59}$.

Therefore, the ac ripple voltage $\tilde{V}_p$ generated at the interconnection point $51a'$ is given by the attenuated result of the ac ripple voltage $\tilde{V}_{cc}$ supplied at the source voltage supply terminal 51a by the ac impedance $Z_e$ and the source voltage ripple removing resistor $R_{51}$ as $$\tilde{V}_\nu = \frac{Z_r}{R_{51} + Z_r} \tilde{V}_{cc}$$

Thus, the ac ripple signal current leaking to the base of the transistor $Q_{60}$ of the following stage through the collector load means (diode $D_{51}$) and the transistor $Q_{53}$ becomes sufficiently small. As the result, the ac ripple voltage leaking at the output pin 8 of the audio power amplifier becomes also sufficiently small.

What is claimed is:

1. A transistor circuit comprising a source voltage supply terminal, a first conductivity type transistor, collector load means, emitter impedance means for said first conductivity type transistor, first voltage dividing biasing means, second voltage dividing biasing means, a source voltage ripple removing impedance, and a source voltage ripple removing second conductivity type transistor, said first conductivity type transistor having an emitter connected to a reference potential through said emitter impedance means, a collector connected to one end of said collector load means, the other end of said collector load means connected to one end of said source voltage ripple removing impedance, the other end of said source voltage ripple removing impedance connected to said source voltage supply terminal, said first and second voltage dividing biasing means connected in series to each other between said source voltage supply terminal and the reference potential, the biasing voltage for the base-emitter junction of said first conductivity type transistor set by the voltage generated at an interconnection point between said first and second voltage dividing biasing means, and said source voltage removing second conductivity type transistor having an emitter connected to the interconnection point of said collector load means and said source voltage ripple removing impedance, a base to the emitter of said first conductivity type transistor, and a collector to the reference potential.

2. A transistor circuit comprising a source voltage supply terminal, first conductivity type differential pair transistors, collector load means, emitter impedance means, first voltage dividing biasing means, second voltage dividing biasing means, a source voltage ripple removing impedance, and a source voltage ripple removing second conductivity type transistor, said first conductivity type differential pair transistors having respective emitters connected in common to a reference potential through said emitter impedance means, one end of said collector load means connected to the collector of one transistor of said first conductivity type differential pair transistors, the other end of said collector load means connected to one end of said source voltage ripple removing impedance, the other end of said source voltage ripple removing impedance connected to said source voltage supply terminal, said first and second voltage dividing biasing means connected in series to each other between said source voltage supply terminal and the reference potential, the biasing voltages for the respective base-emitter junctions of said first conductivity type differential pair transistors set by the voltage generated at an interconnection point between said first and second voltage dividing biasing means, said source voltage ripple removing second conductivity type transistor having an emitter connected to the interconnection point of said collector load means and said source voltage ripple removing impedance, a base to the interconnection point of the respective emitters of said first conductivity type differential pair transistors and a collector to said reference potential.

3. A transistor circuit according to claim 1, in which the emitter of said source voltage ripple removing second conductivity type transistor is connected to the interconnection point of said collector load means and said source voltage ripple removing impedance through constant voltage biasing means.

4. A transistor circuit according to claim 3, in which said constant voltage biasing means is a Zener diode.

5. A transistor circuit according to claim 3, in which said constant voltage biasing means is a forward biased diode.

6. A transistor circuit according to claim 3, in which said interconnection point of said first and second voltage dividing biasing means is connected to the base of said first conductivity type transistor through an input resistance, and a source voltage ripple removing capacitor is connected in parallel with said second voltage dividing biasing means.

7. A transistor circuit according to claim 2, in which the emitter of said source voltage ripple removing second conductivity type transistor is connected to the interconnection point of said collector load means and said source voltage ripple removing impedance.

8. A transistor circuit according to claim 7, in which said interconnection point of said first and second voltage dividing biasing means is connected to the base of the other transistor of said first conductivity type differential pair transistors through an input resistor, and a source voltage ripple removing capacitor is connected in parallel with said second voltage dividing biasing means.

9. A transistor circuit according to claim 8, in which said first voltage dividing biasing means is connected to said source voltage supply terminals through a source voltage ripple removing filter including a capacitor and a resistor.

10. A transistor circuit according to claim 9, in which the base of said source voltage ripple removing second conductivity type transistor is connected to the interconnection point of the commonly connected emitters of said first conductivity type differential pair transistors through the emitter-base junction of the other transistor of the first conductivity type.

11. A transistor circuit according to claim 9, in which said constant voltage biasing means is a Zener diode.

12. A transistor circuit according to claim 9, in which said constant voltage biasing means is a forward biased diode.

13. A monolithic semiconductor integrated circuit comprising:
an input amplifier including at least one first conductivity type transistor having a base connected to the signal input terminal, a collector connected to the signal output terminal and an emitter connected to one end of the emitter biasing resistor means, a source voltage supply terminal, a reference potential terminal, and load resistance means connected between said voltage supply terminal and said collector, the other end of said emitter biasing resistor means connected to said reference potential terminal; and a source voltage ripple removing circuit including voltage dividing resistance means provided between said voltage supply terminal and said collector load resistance means, and a second conductivity type transistor having an emitter connected to the interconnection point of said voltage dividing resistance means and said collector load means, a base connected to the emitter of said first conductivity type transistor, and a collector connected to said reference potential terminal.

14. A transistor circuit according to claim 13, further comprising constant voltage biasing means connected between the interconnection point of said voltage dividing resistance means and said collector load means and the emitter of said second conductivity type transistor.

15. A transistor circuit according to claim 13, further comprising biasing voltage dividing circuit connected between said source voltage supply terminal and said reference potential terminal and biasing the base of said first conductivity type transistor with the dc bias voltage generated in said biasing voltage dividing circuit.

16. A transistor circuit according to claim 15, in which said biasing voltage dividing circuit comprises a series connection of a first and a second voltage dividing biasing means, and said ripple removing circuit further comprises a filtering capacitor connected in parallel with said second voltage dividing biasing means.

* * * * *